US011119121B2

(12) United States Patent
Atobe

(10) Patent No.: US 11,119,121 B2
(45) Date of Patent: Sep. 14, 2021

(54) PROBE PIN ALIGNMENT DEVICE

(71) Applicant: Showa Shinku Co., Ltd., Sagamihara (JP)

(72) Inventor: Yoshihisa Atobe, Sagamihara (JP)

(73) Assignee: Showa Shinku Co., Ltd., Sagamihara (JP)

( * ) Notice: Subject to any disclaimer, the term of this patent is extended or adjusted under 35 U.S.C. 154(b) by 0 days.

(21) Appl. No.: 16/858,448

(22) Filed: Apr. 24, 2020

(65) Prior Publication Data

US 2020/0355728 A1   Nov. 12, 2020

(30) Foreign Application Priority Data

May 9, 2019   (JP) .............................. JP2019-088801

(51) Int. Cl.
*G01R 1/067*   (2006.01)
*G01R 1/073*   (2006.01)

(52) U.S. Cl.
CPC ..... *G01R 1/06794* (2013.01); *G01R 1/07307* (2013.01)

(58) Field of Classification Search
CPC ...................... G01R 1/06794; G01R 1/07307
See application file for complete search history.

(56) References Cited

U.S. PATENT DOCUMENTS

| 7,589,543 B2 * | 9/2009 | Yamada | G01R 31/2891 324/750.19 |
| 2010/0117672 A1 * | 5/2010 | Portune | G01R 31/2891 324/750.24 |
| 2011/0089965 A1 * | 4/2011 | Endres | G01R 35/00 324/755.01 |
| 2017/0146567 A1 | 5/2017 | Yue et al. | |
| 2017/0219625 A1 * | 8/2017 | Saiki | G01R 31/2891 |

FOREIGN PATENT DOCUMENTS

JP   2017-096949 A   6/2017

* cited by examiner

*Primary Examiner* — Paresh Patel
(74) *Attorney, Agent, or Firm* — Howard & Howard Attorneys PLLC

(57) ABSTRACT

Provided is a probe pin alignment device that can readily correct a positional deviation between a probe pin and an electrode pad in real time and can prevent damage to the probe pin or an electronic device. The probe pin alignment device includes a mirror to reflect a mirror image of the electrode pad while the probe pin is approaching a crystal oscillator, a camera to take a picture containing an image of the probe pin and the mirror image reflected on the mirror, a deviation measurer to measure a deviation between the position of the probe pin and the position of the electrode pad in the taken picture, a displacer to relatively displace a carrier and the probe pin, and a controller to cause the displacer to relatively displace the carrier and the probe pin such that the deviation is substantially zero.

9 Claims, 9 Drawing Sheets

PROBE PIN ALIGNMENT DEVICE

CROSS-REFERENCE TO RELATED APPLICATION

This application claims the benefit of Japanese Patent Application No. 2019-088801, filed on May 9, 2019 the entire disclosure of which is incorporated by reference herein.

FIELD

This application relates to a probe pin alignment device.

BACKGROUND

Probe pins are used in inspection or transfer of an electronic device equipped with electrodes, such as a liquid crystal display element, semiconductor element, or piezoelectric element. The inspection or transfer of the electronic device is executed by bringing the tips of the probe pins into contact with electrode pads of the electronic device, and thus requires contact between the probe pins and the electrode pads at appropriate positions.

Unexamined Japanese Patent Application Publication No. 2017-96949 discloses an inspection system for liquid crystal display elements applied to a liquid crystal display apparatus. As illustrated in FIG. 10 of Unexamined Japanese Patent Application Publication No. 2017-96949, the inspection system causes a mirror disposed at a side position to reflect a mirror image in which probe pins are in contact with electrode pads of an liquid crystal display panel, and causes a camera to take a picture of the mirror image reflected on the mirror. The use of the mirror and the camera can achieve visualization of the contact positions between the electrode pads and the probe pins and appropriate observation of the contact state.

SUMMARY

A probe pin alignment device according to an aspect of the disclosure performs position alignment of an electronic device placed on a surface of a base and a probe pin of which the tip is brought into contact with an electrode pad of the electronic device. The probe pin alignment device includes: a mirror configured to reflect a mirror image of at least the electrode pad of the electronic device while the probe pin is approaching the electrode pad; a camera configured to take a picture including an image of the probe pin approaching the electrode pad and the mirror image reflected on the mirror; a deviation measurer configured to measure a deviation between the position of the probe pin and the position of the electrode pad of the electronic device in the picture taken by the camera; a displacer configured to relatively displace the base and the probe pin; and a controller configured to cause the displacer to relatively displace the base and the probe pin such that the deviation measured by the deviation measurer is substantially zero.

The mirror may be inclined from the surface of the base.

The probe pin alignment device may further include a block provided with the probe pin, and the mirror may be attached on the block.

The block may have an inclined surface opposite to and inclined from the surface of the base. The mirror may be attached on the inclined surface, and the probe pin may be attached to the block while extending through the mirror attached on the inclined surface. The deviation measurer may measure a deviation between the position of the probe pin and the position of the electrode pad of the electronic device, based on (i) the position of the probe pin extending through the mirror in a real image and (ii) the position of the electrode pad of the electronic device in the mirror image in the picture taken by the camera.

The controller may cause the displacer to conduct relative displacement such that the position of the electrode pad of the electronic device accords with the position of the probe pin in the taken picture based on the deviation measured by the deviation measurer.

The mirror may also reflect a mirror image of the probe pin approaching the electrode pad. The deviation measurer may measure a deviation between the position of the probe pin and the position of the electrode pad of the electronic device, based on the position of the probe pin and the position of the electrode pad of the electronic device in the mirror images in the picture taken by the camera.

BRIEF DESCRIPTION OF THE DRAWINGS

A more complete understanding of this application can be obtained when the following detailed description is considered in conjunction with the following drawings, in which.

DETAILED DESCRIPTION

Embodiments of a probe pin alignment device according to the disclosure will now be described with reference to the accompanying drawings. These embodiments are provided for exemplary purposes only and do not limit the scope of the disclosure. Persons skilled in the art can replace some or all of the components of the embodiments with their equivalents to configure other embodiments, which are also encompassed in the scope of the disclosure.

EMBODIMENT 1

A frequency adjustment apparatus equipped with a probe pin alignment device according to the disclosure will now be described with reference to FIGS. 1 to 4.

Figure 1:
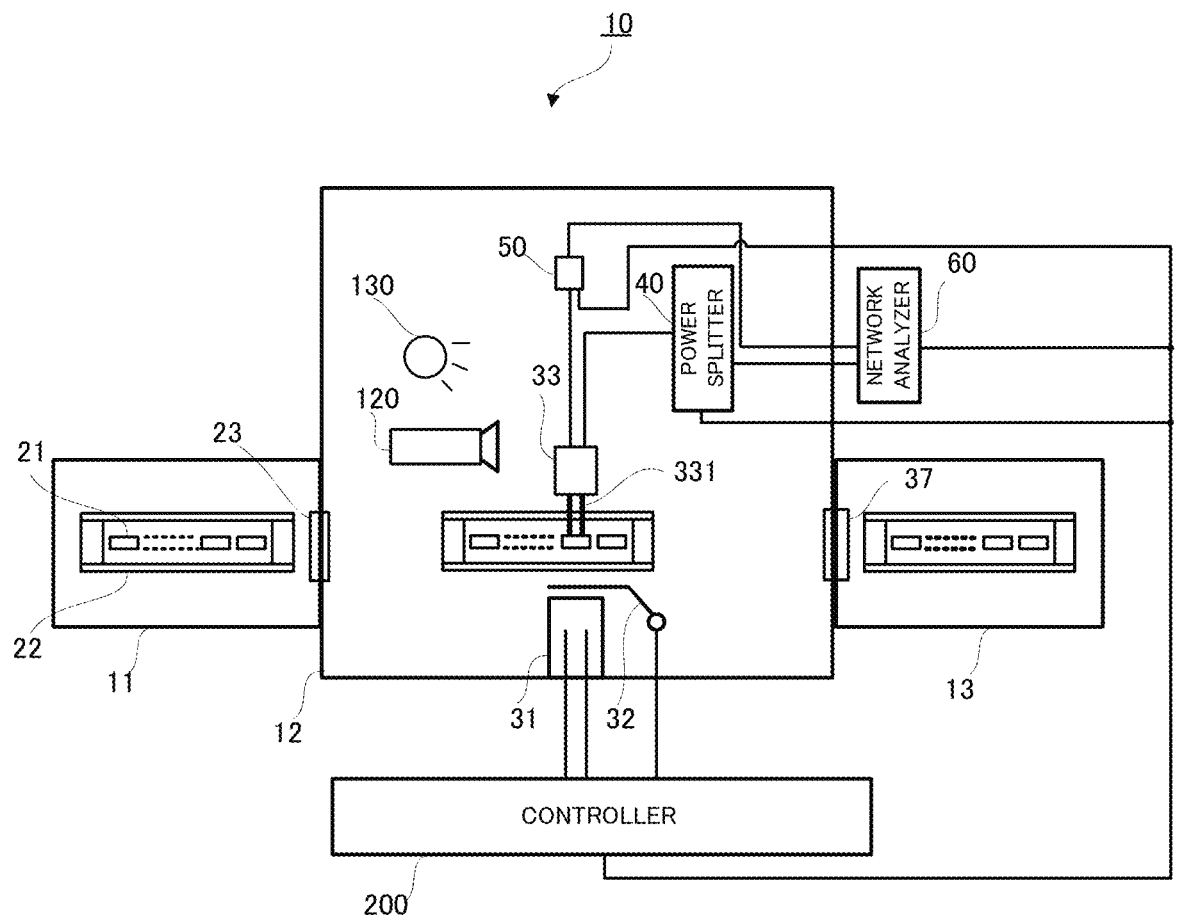
FIG. 1 is a conceptual diagram illustrating a side view of a frequency adjustment apparatus equipped with a probe pin alignment device according to Embodiment 1.
Figure 2:
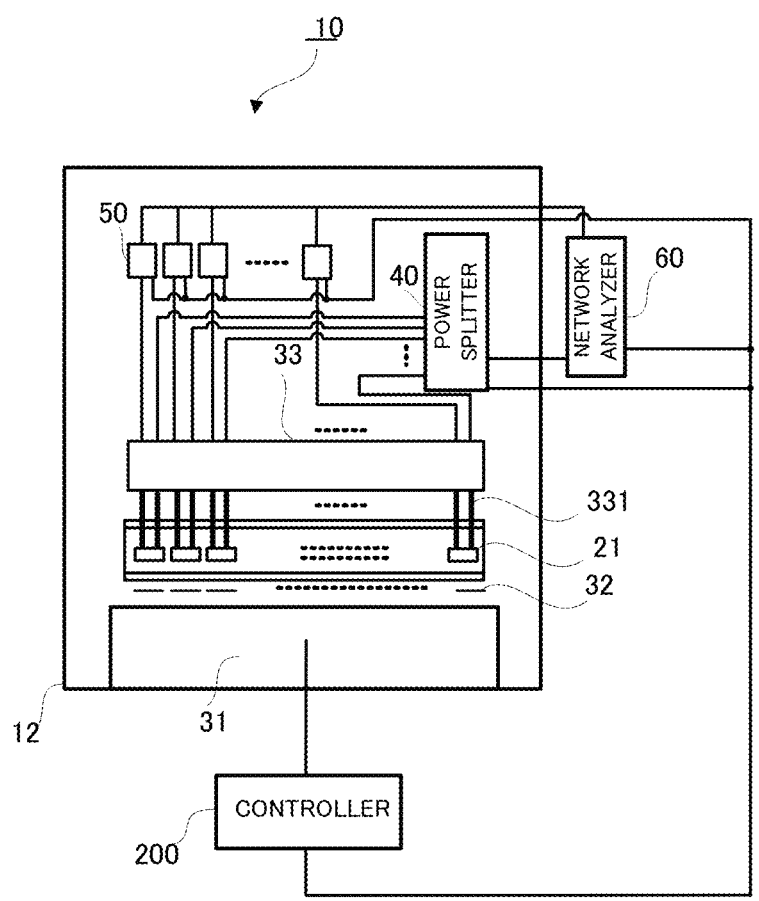
FIG. 2 is a conceptual diagram illustrating the frequency adjustment apparatus equipped with the probe pin alignment device according to Embodiment 1 when an etching chamber of the frequency adjustment apparatus is viewed from the side adjacent to an extraction chamber.

FIGS. 1 and 2 are schematic diagrams each illustrating a frequency adjustment apparatus according to this embodiment. In order to facilitate an understanding, the direction of transportation of a carrier for carrying crystal oscillators is defined as x axis, the depth direction of the carrier is defined as y axis, and the direction perpendicular to the surface of the carrier is defined as z axis.

FIG. 1 illustrates an internal configuration of a frequency adjustment apparatus 10. The frequency adjustment apparatus 10 according to this embodiment has a load-lock system including three chambers: a preparation chamber 11, an etching chamber 12, and an extraction chamber 13. FIG. 2 illustrates a configuration of the etching chamber 12 of the frequency adjustment apparatus 10 illustrated in FIG. 1 as viewed from a side.

In the preparation chamber 11, a carrier 22 including a plurality of crystal oscillators 21 mounted thereon is installed. After decompression of the preparation chamber 11 to the same pressure as the etching chamber 12, a gate valve 23 is opened, and the crystal oscillators 21 mounted on the carrier 22 are then transported by a transport mechanism (not shown) into the etching chamber 12. The crystal oscillators 21 are arranged in the row and column directions on the carrier 22, which is transported by the transport mechanism in the row direction. The row direction corresponds to the x-axis direction and the column direction corresponds to the y-axis direction in FIGS. 1 and 2. The number of the crystal oscillators 21 mounted on the carrier 22 is defined as M×N.

Figure 3A:
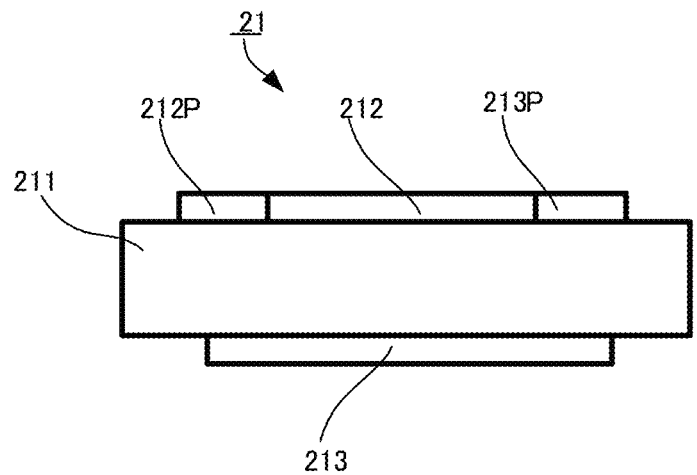
FIG. 3A illustrates a side view of a configuration of a crystal oscillator.
Figure 3B:
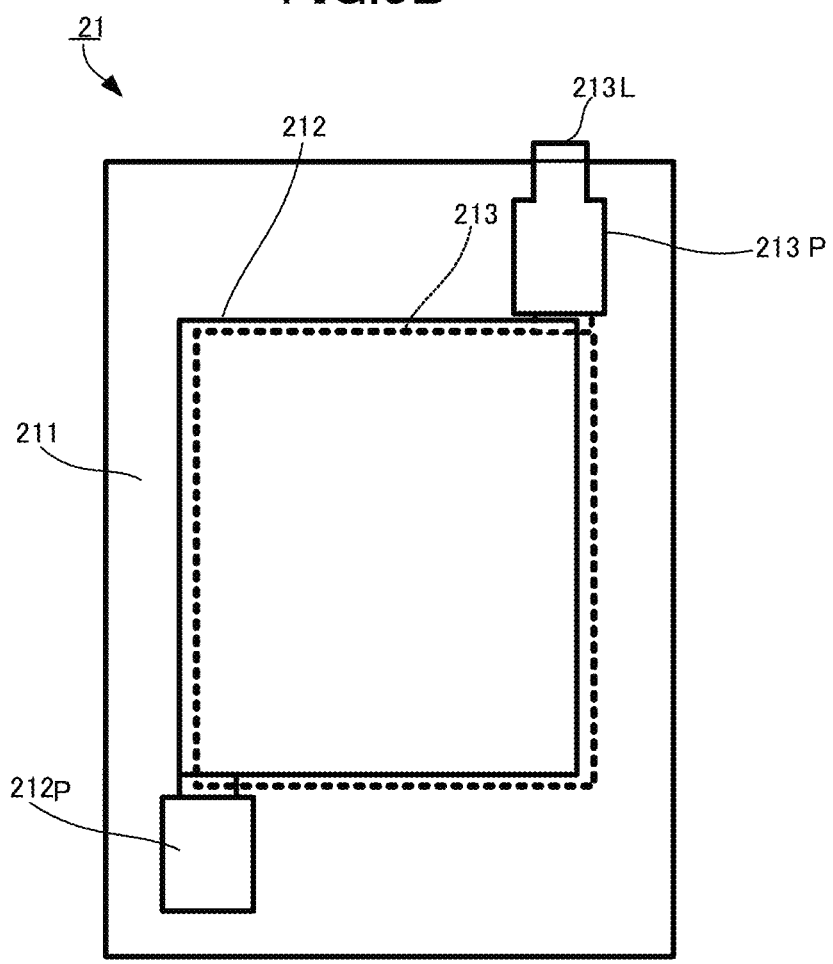
FIG. 3B illustrates a top view of the configuration of the crystal oscillator.

With reference to FIGS. 3A and 3B, each of the crystal oscillators 21 to be inspected includes a crystal piece 211 and electrodes 212 and 213 for voltage application to the crystal piece 211. The electrodes 212 and 213 are disposed on the respective opposite main surfaces of the crystal piece 211. The electrode 212 is connected to an electrode pad 212P. The electrode 213 is connected to an electrode pad 213P disposed on the same main surface as the electrode pad 212P, for example, via a lead electrode 213L disposed on a side surface of the crystal piece 211. The individual electrode pads 212P and 213P are arranged at diagonal positions on the same main surface.

The crystal oscillators 21 transported into the etching chamber 12 are subject to measurement of resonance frequencies by means of a contact mechanism 33 (described later), before, during, or after an etching process. Upon this measurement, a probe pin alignment device 100 illustrated in FIG. 5 aligns the positions of probe pins 331A and 331B of the contact mechanism 33 and the positions of the electrode pads 212P and 213P of the crystal oscillators 21. The configuration and operation of the probe pin alignment device 100 will be described later. The probe pins are referred to as "probe pins 331" or "probe pins 331A and 331B" as required.

The etching chamber 12 illustrated in FIGS. 1 and 2 accommodates an ion gun 31. The ion gun 31 has an opening for causing all the crystal oscillators 21 in any single column among the crystal oscillators 21 mounted on the carrier 22 to be irradiated with an ion beam. When the carrier 22 is transported in the x-axis direction illustrated in FIG. 1 until the crystal oscillators 21 (targets of frequency adjustment) face the ion gun 31, the ion gun 31 performs simultaneous ion beam etching of all the crystal oscillators 21 (adjustment targets) in the column that faces the ion gun 31. After completion of etching of the single column, the ion gun 31 is shifted in the row direction (the x-axis direction illustrated in FIGS. 1 and 2) by a driving mechanism and then performs etching for the subsequent column. Alternatively, the ion gun 31 may have openings each configured to face a corresponding one of the crystal oscillators 21 in any single column.

The etching chamber 12 is further provided with a shutter 32 for activating or inactivating ion beam emission from the ion gun 31. The shutter 32 allows or does not allow ions emitted from the ion gun 31 to pass through the shutter 32, under the control of the controller 200.

The ion gun 31 and the shutter 32 are caused by the controller 200 to adjust the thickness of each electrode 213 by etching the electrode 213 such that the resonance frequency of the crystal oscillator 21 accords with the target value. Although only the electrode 213 on one surface is etched in this embodiment, the electrodes 212 and 213 on both surfaces may be etched.

This adjustment of the resonance frequencies of the crystal oscillators 21 in the etching chamber 12 is followed by decompression of the extraction chamber 13 to the same pressure as the etching chamber 12. A gate valve 37 is opened, and the crystal oscillators 21 on each carrier 22 are then transported into the extraction chamber 13. The gate valve 37 is closed, and the extraction chamber 13 is then pressurized to the atmospheric pressure. The carrier 22 including the crystal oscillators 21 mounted thereon is then extracted from the extraction chamber 13.

The etching chamber 12 is also provided with the contact mechanism 33 for connecting the electrodes 212 and 213 (electrode pads 212P and 213P) of the crystal oscillators 21 to a network analyzer 60. When the probe pins 331A and 331B of the contact mechanism 33 come into contact with the respective electrodes 212 and 213 (electrode pads 212P and 213P), the signals are transmitted from the electrodes 212 and 213 to the network analyzer 60, thereby causing measurement of the resonance frequencies of the crystal oscillators 21.

A configuration of the contact mechanism 33 will now be described with reference to FIG. 4. The contact mechanism 33 includes plural pairs of probe pins 331A and 331B. The number of the pairs is equal to the number of the crystal oscillators 21 accommodatable in each column on the carrier 22. For example, in the case where the carrier 22 can accommodate N crystal oscillators 21 in each column, the contact mechanism 33 includes N pairs of probe pins 331A and 331B. The contact mechanism 33 connects the probe pins 331A and 331B to the respective electrode pads 212P and 213P of the crystal oscillators 21, under the control of the controller 200. In the illustrated example, the contact mechanism 33 includes six pairs of probe pins 331A and 331B.

The contact mechanism 33 includes a block 332 composed of an insulating material, such as a resin, a substrate 333 for wiring, the probe pins 331A and 331B, and arms 337 coupled to a driving mechanism (not shown).

The substrate 333 is attached to the upper surface of the block 332. The block 332 has through holes 335 extending from the upper surface to the lower surface. The probe pins 331A and 331B are inserted through the respective through holes 335. The probe pins 331A and 331B, on one end, are connected to respective electrode pads on the substrate 333. The probe pins 331A and 331B transmit excitation of the crystal oscillators 21 to the outside.

The block 332 is provided with mirrors 110 at both ends, which are constituent elements of the probe pin alignment device 100 (described later). Specifically, the ends of the block 332 have inclined surfaces inclined from the upper surface of the carrier 22, and the mirrors 110 are attached on the respective inclined surfaces. The mirrors 110 have pinholes 334 for accommodating the respective probe pins 331A and 331B. The probe pins 331A and 331B are attached to the block 332 while extending through the pinholes 334 of the mirrors 110.

The block 332 of the contact mechanism 33 is moved toward (forward) or away from (rearward) the crystal oscillators 21 by the arms 337 coupled to the driving mechanism (not shown). In this embodiment, the contact mechanism 33 moves in the up-down direction (z-axis direction) within the etching chamber 12. Springs (not shown) are inserted in the probe pins 331 or the block 332. The contact mechanism 33 moves forward and thus urges the probe pins 331, on one end, onto the electrode pads 212P and 213P of the crystal oscillators 21 by means of the elastic forces of the springs. In contrast, the contact mechanism 33 moves rearward and thus separates the probe pins 331A and 331B, on one end, from the electrode pads 212P and 213P. The above-described configuration enables the contact mechanism 33 to achieve simultaneous connection to all the electrode pads 212P and 213P of the crystal oscillators 21 accommodated in any single column on the carrier 22.

The other ends of the probe pins 331 may be connected to a power splitter 40 via the electrode pads on the substrate 333. Alternatively, the other ends of the probe pins 331 may be connected to respective integrated circuits 50 corresponding to the crystal oscillators 21 and having electrodes to be connected to the probe pins 331.

As illustrated in FIGS. 1 and 2, the frequency adjustment apparatus 10 is equipped with the network analyzer 60 for exciting the crystal oscillators 21 and measuring their impedances.

The network analyzer 60 includes a processor and a memory and measures the frequency characteristic of an electric power flowing through a circuit network. The network analyzer 60 is composed of a receiver that receives a measurement signal from a crystal oscillator connected to the network analyzer 60 and outputs a phase difference and an amplitude ratio based on the comparison with the reference signal, and a calculator that calculates the frequency characteristic of the crystal oscillator from the phase difference and the amplitude ratio for each frequency. Although the network analyzer 60 is composed of the receiver and the calculator in this embodiment, the functions of the calculator may be performed by the controller 200.

The network analyzer 60 preliminarily measures an amplitude ratio and a phase difference between input and output signals of a peripheral circuit, which is composed of the power splitter 40, an impedance conversion circuit included in an outputter of the power splitter 40, and the integrated circuits 50, while the probe pins 331A and 331B are connected to not the crystal oscillators 21 but known impedance elements. The network analyzer 60 then calculates the frequency characteristic of the peripheral circuit and stores the calculated characteristic. In order to measure the frequency characteristic of each crystal oscillator 21, the network analyzer 60 supplies an exciting signal via the power splitter 40 to the crystal oscillator 21 while scanning the frequency, and acquires a signal (output) indicating a current flowing in the crystal oscillator 21 via the integrated circuit 50 (switch). The network analyzer 60 calculates the difference between the acquired input-output characteristic and the input-output characteristic of the peripheral circuit alone that was acquired in advance, and thus obtains the frequency-impedance characteristic and the resonance frequency of the crystal oscillator 21.

The power splitter 40 splits the exciting signal supplied from the network analyzer 60 while maintaining the identity of the signal. The power splitter 40 then supplies a split of the exiting signal to the electrode 212 of each crystal oscillator 21 via the probe pin 331A. This operation causes simultaneous excitation of the crystal oscillators 21.

Each integrated circuit 50 functions as an on-off switch and is connected to the electrode 213 of each crystal oscillator 21 via a cable 34B. When activated, the integrated circuit 50 supplies the network analyzer 60 with a signal indicating a current flowing in each crystal oscillator 21. The integrated circuits 50 serve as a selector for sequentially selecting one of the crystal oscillators 21 to be inspected.

The controller 200 includes a processor and a memory. The controller 200 controls the individual components of the frequency adjustment apparatus 10 based on the detected resonance frequencies of the crystal oscillators 21 in accordance with a predetermined control routine, so as to adjust the resonance frequencies of the crystal oscillators 21 to the target frequency. The controller 200 also controls the probe pin alignment device 100. Although the power splitter 40 performs simultaneous excitation of the crystal oscillators 21 in this embodiment, a general procedure may be used for measuring the frequency while sequentially exciting one of the crystal oscillators 21 to be inspected with a switching board.

Figure 5:
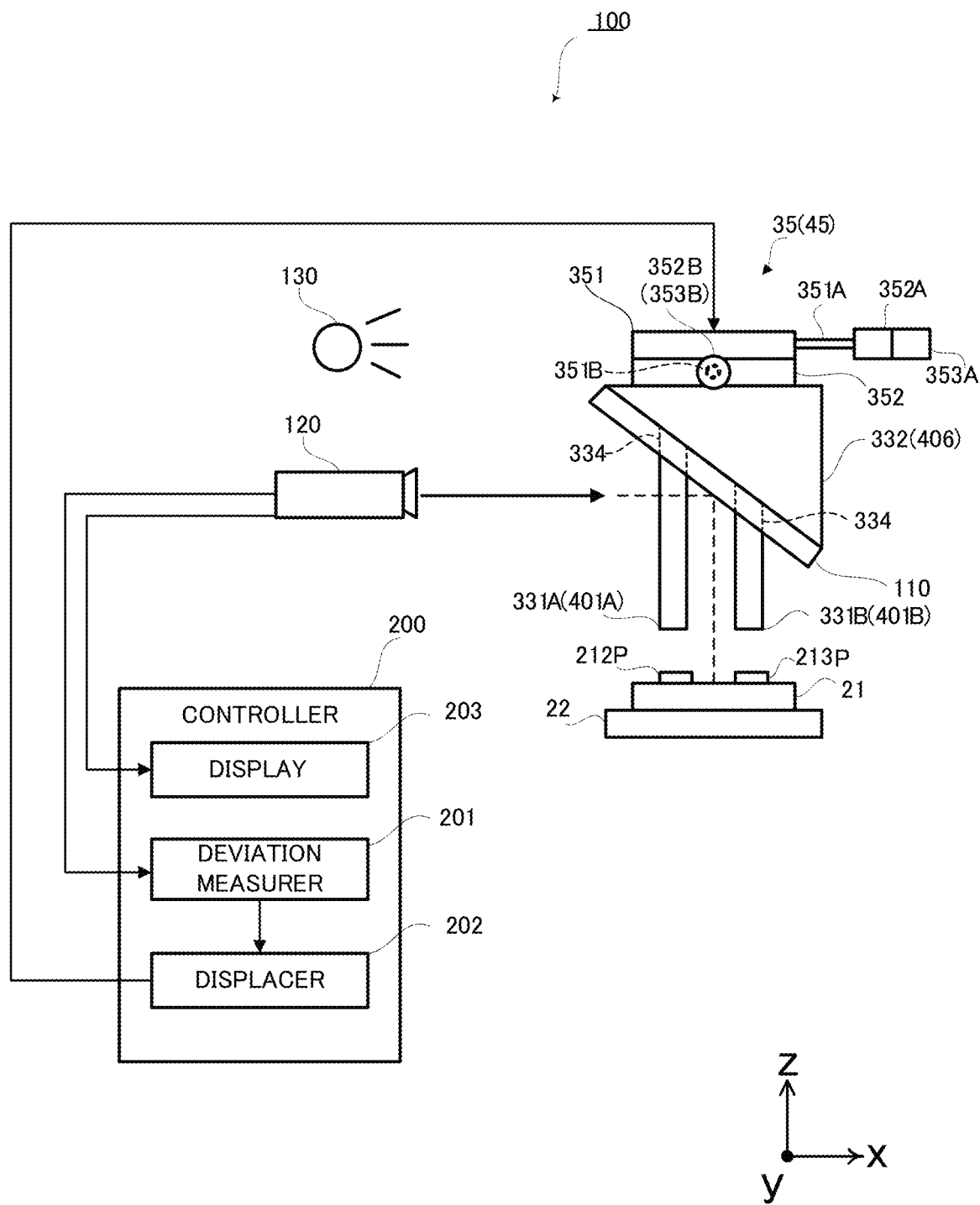
FIG. 5 is a conceptual diagram illustrating the probe pin alignment device.

The probe pin alignment device 100 will now be described with reference to FIG. 5.

The probe pin alignment device 100 is equipped with the mirrors 110 attached on the block 332, the camera 120 for taking a picture containing mirror images reflected on the mirrors 110 and real images, a deviation measurer 201 for measuring a deviation between the probe pin 331A or 331B and the electrode pad 212P or 213P from the taken picture, a displacer 202 for displacing the block 332 based on the deviation, the controller 200 for controlling the deviation measurer 201 and the displacer 202, and a light source 130.

Figure 4:
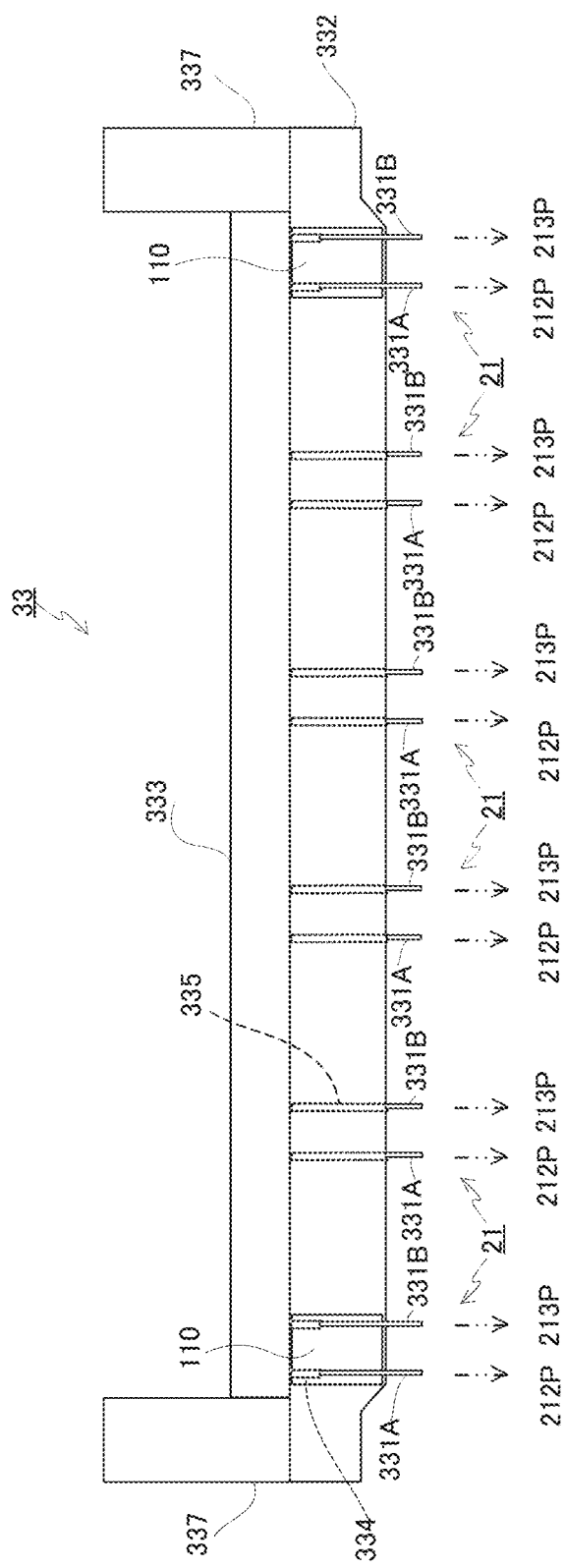
FIG. 4 illustrates a configuration of a contact mechanism.

As illustrated in FIG. 4, the mirrors 110 are attached on both ends of the block 332. As illustrated in FIG. 5, each end of the block 332 has an inclined surface inclined at 45° from the upper surface of the carrier 22 and provided with the mirror 110. The mirror 110 has the pinholes 334 for accommodating the respective probe pins 331A and 331B. The probe pins 331A and 331B extend through the pinholes 334 and attached to the inclined surfaces. The probe pins 331A and 331B move in the direction perpendicular to the upper surface of the carrier 22. Since the probe pins 331A and 331B are attached while extending through the mirror 110 attached on the inclined surface inclined at 45° from the upper surface of the carrier 22, the mirror 110 reflects a mirror image of the electrode pads 212P and 213P as viewed from directly above.

Since the probe pins 331A and 331B are attached while extending through the mirror 110 attached on the inclined surface of the block 332, the mirror 110 is able to reflect a mirror image of the electrode pads 212P and 213P while the probe pins 331A and 331B are approaching the electrode pads 212P and 213P. The concept of the state "while the probe pins 331A and 331B are approaching the electrode pads 212P and 213P" encompasses all the three states: the state before movement of the probe pins 331A and 331B toward the electrode pads 212P and 213P, the moving state, and the stopping state. The above-described positional relationship between the mirror 110 and the probe pins 331A and 331B can achieve the position alignment before the probe pins 331A and 331B come into contact with the electrode pads 212P and 213P.

In this embodiment, the camera 120 is disposed such that the line segment from the crystal oscillator 21 on the carrier 22 to the mirror 110 forms an angle of 90° from the optical axis of the camera 120 to the mirror 110. Because of the probe pins 331A and 331B shiftable in the direction identical to the optical axis, the positional deviation between the probe pin 331 and the electrode pad 212P or 213P can be measured at high accuracy in a state of non-contact between the probe pin 331 and the electrode pad 212P or 213P, even if the crystal oscillator 21 has extremely small electrode pads 212P and 213P.

The camera 120 is disposed at a side position between the block 332 movable in the up-down direction (z-axis direction) and the crystal oscillators 21. The camera 120 takes a picture containing real images of the probe pins 331A and 331B extending through the mirrors 110 and mirror images reflected on the mirrors 110 under the light emitted from the light source 130.

The camera 120 is a CCD camera that takes a picture containing a mirror image reflected on the mirror 110 and real image of the probe pins 331A and 331B. The camera 120 is equipped with a lens having a large depth of field and can thus focus on both of the probe pins 331A and 331B and the electrode pads 212P and 213P. The camera 120 is disposed inside the etching chamber 12. Since the camera 120 is in the vacuum environment of the etching chamber 12, the mirror 110 has a reduced distance from the camera 120, thereby reducing angular deviations. The CCD camera may be replaced with a camera including an image sensor, such as a CMOS sensor.

The camera 120 is connected to the deviation measurer 201 and a display 203 of the controller 200. The display 203 is connected to a monitor (not shown). The monitor enables an operator to check the taken picture displayed on the monitor.

Figure 7A:
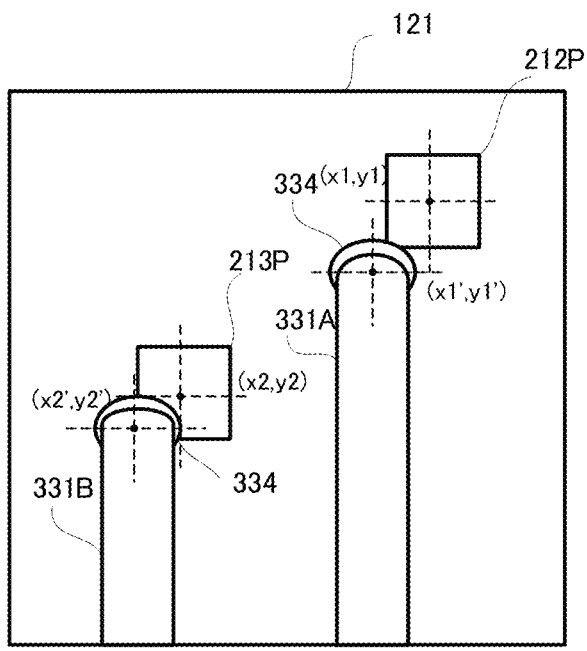
FIG. 7A illustrates an exemplary picture taken by a camera that captures probe pins and a mirror reflecting electrode pads before correction of deviations.

The deviation measurer 201 measures a deviation between the probe pin 331A or 331B and the electrode pad 212P or 213P from the picture taken by the camera 120. The deviation indicates a distance from the midpoint of the electrode pad 212P or 213P of the crystal oscillator 21 to the intersection between the straight line extended from the probe pin 331A or 331B in the forward direction of the contact mechanism 33 and the plane including the electrode pads 212P and 213P. Specifically, as illustrated in FIG. 7A, the deviation measurer 201 executes image processing and deems the midpoint of the electrode pad 212P or 213P in the mirror image in the taken picture on a screen 121 as a reference point. More specifically, the position coordinates of the midpoint of the electrode pad 212P are defined as (x1, y1) and the position coordinates of the midpoint of the electrode pad 213P are defined as (x2, y2). In addition, the position where the probe pin 331A or 331B extends through the mirror 110 in the real image in the taken picture on the screen 121 is deemed as the position of the probe pin 331A or 331B. Specifically, the position coordinates of the center of the area where the probe pin 331A extends though the mirror 110 is defined as (x1', y1') and the position coordinates of the center of the area where the probe pin 331B extends through the mirror 110 is defined as (x2', y2'). Alternatively, the position coordinates of the respective centers of the pinholes 334 of the mirror 110 may be defined as (x1', y1') and (x2', y2'). Although the inner diameter of the pinholes 334 of the mirror 110 is larger than the outer diameter of the probe pins 331A and 331B in the example illustrated in FIGS. 7A and 7B, the inner diameter of the pinholes 334 of the mirror 110 may be identical to the outer diameter of the probe pins 331A and 331B. The inner diameter of the pinholes 334 of the mirror 110 is defined to be smaller than the length of each side of the electrode pads 212P and 213P. Using the above-described position coordinates, the deviation between the electrode pad 212P and the probe pin 331A is measured as (x1-x1', y1-y1') and the deviation between the electrode pad 213P and the probe pin 331B is measured as (x2-x2', y2-y2').

The displacer 202 displaces the block 332 provided with the probe pins 331A and 331B in parallel to the upper surface of the carrier 22 based on the deviations measured by the deviation measurer 201. The displacer 202 displaces the block 332 such that the deviations measured by the deviation measurer 201 are substantially zero.

The block 332 is displaced in parallel to the upper surface of the carrier 22 with a stage unit 35 provided to the block 332. The stage unit 35 includes an X stage 351 for displacing the block 332 in the x-axis direction, a Y stage 352 for displacing the block 332 in the y-axis direction, shifting shafts 351A and 351B for shifting these stages, motors 352A and 352B for driving the shifting shafts 351A and 351B, and encoders 353A and 353B for measuring a distance of displacement.

Examples of the motors 352A and 352B include AC servomotors, DC servomotors, and stepping motors. Examples of the encoders 353A and 353B include motor encoders and linear scales. In response to a shift of the X stage 351 or the Y stage 352 in the x- or y-axis direction by a unit distance, the encoder 353A or 353B generates an encoder signal indicating shift information and outputs the signal to the controller 200.

Figure 7B:
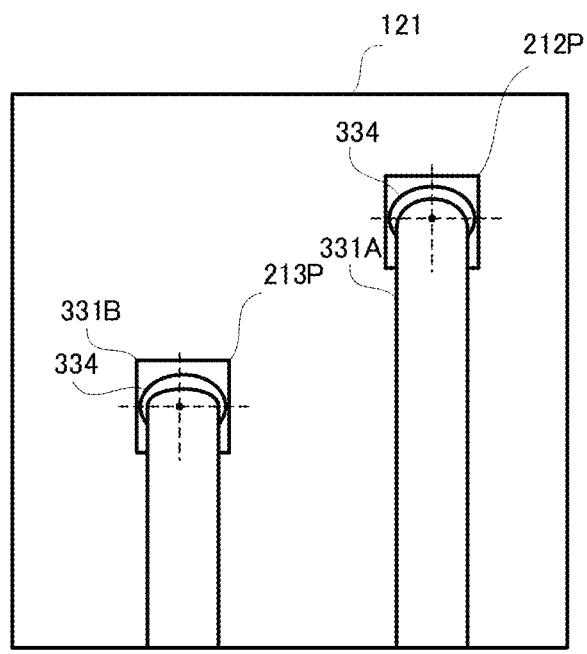
FIG. 7B illustrates an exemplary picture taken by the camera that captures the probe pins and the mirror reflecting the electrode pads after correction of deviations.

Specifically, the displacer 202 shifts the stage unit 35 so as to align the position of the electrode pad 212P and the position of the probe pin 331A (x1=x1' and y1=y1'), and align the position of the electrode pad 213P and the position of the probe pin 331B (x2=x2' and y2=y2'). The correction of deviations by the displacer 202 can achieve position alignment, such that the midpoint of the electrode pad 212P accords with the center of the probe pin 331A, and the midpoint of the electrode pad 213P accords with the center of the probe pin 331B, as illustrated in FIG. 7B.

The controller 200 inputs the deviations measured by the deviation measurer 201 to the displacer 202 and causes the displacer 202 to shift the stage unit 35.

The light source 130 is disposed at a side position between the contact mechanism 33 and the crystal oscillators 21 mounted on the carrier 22. Examples of the light source 130 include a high-intensity white LED light, an LED light in a color other than white, and a xenon light. The light source 130 illuminates the crystal oscillators 21 and the probe pins 331A and 331B. The light source 130 may illuminate the crystal oscillators 21 and the probe pins 331A and 331B for a predetermined period of approximately several microseconds, for example, in accordance with a flashing signal output from the controller 200. In the case where the light source 130 blinks in accordance with flashing signals, the controller 200 may activate the shutter of the camera 120 in accordance with the blink timings.

Figure 6:
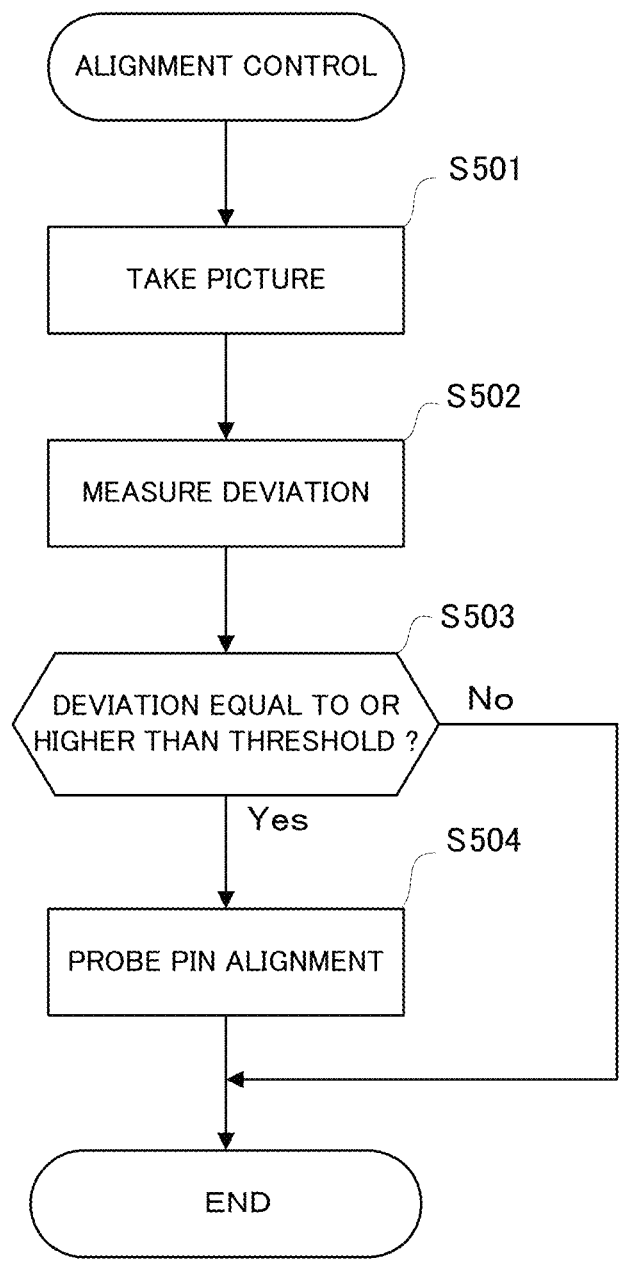
FIG. 6 is a flowchart illustrating the process of an operation in the probe pin alignment device.

The process of alignment control will now be explained with reference to the flowchart of FIG. 6.

Before activation of the probe pin alignment device 100, the carrier 22 including the crystal oscillators 21 mounted thereon is transported by the transport mechanism from the preparation chamber 11 into the etching chamber 12, as illustrated in FIG. 1. The carrier 22 then faces the ion gun 31 in the etching chamber 12. The transportation of the carrier 22 is stopped at the position where the N crystal oscillators 21 arranged in a single column in the y-axis direction face the respective N pairs of probe pins 331A and 331B of the contact mechanism 33. The controller 200 detects the stop of the carrier 22 and then starts to control the probe pin alignment device 100.

Before the probe pins 331A and 331B descend toward the electrode pads 212P and 213P, the camera 120 takes a picture containing a mirror image reflected on each mirror 110 attached on the inclined surface of the block 332 and a real image of the probe pins 331A and 331B, and inputs the taken picture to the deviation measurer 201 (Step S501). Although the camera 120 takes a picture of a stopped state of the probe pins 331A and 331B in this embodiment, the camera 120 may take a picture of a moving state of the probe pins 331A and 331B.

The deviation measurer 201 measures a deviation based on (i) the position of the midpoint of the electrode pad 212P or 213P of the crystal oscillator 21 in the mirror image and (ii) the position of the center of the area where the probe pin 331A or 331B extends through the mirror 110 in the real image in the input picture (Step S502). If the measured deviation is a predetermined threshold or more (Step S503; Yes), the deviation measurer 201 inputs the deviation to the displacer 202. If the measured deviation is less than the predetermined threshold (Step S503; No), the process is terminated.

In response to input of the deviation to the displacer 202, the displacer 202 drives the motors 352A and 352B to shift the X stage 351 and the Y stage 352 with the shifting shafts 351A and 351B such that the center of the area where the probe pin 331A or 331B extends through the mirror 110 accords with the midpoint of the electrode pad 212P or 213P (Step S504). The process is then terminated.

After correction of the deviation, the controller 200 causes the probe pins 331A and 331B to descend, thereby bringing the tips of the probe pins 331A and 331B into contact with the respective electrode pads 212P and 213P. The resonance frequencies of the crystal oscillators 21 are then measured.

After measurement of the resonance frequencies and etching process for the N crystal oscillators 21 arranged in the single column, the carrier 22 is transported by the transport mechanism in the x-axis direction by the distance corresponding to a single column and is then stopped. This step is followed by the alignment control for the crystal oscillators 21 in the subsequent column. The above-explained steps are repeated from the first to the last columns of the crystal oscillators 21 mounted on the carrier 22.

If any contaminant, such as dirt, adhering to the probe pin 331A or 331B is found in the picture taken by the camera 120, this contaminant is removed by a contaminant remover that is independently provided. For example, the contaminant remover blows off the contaminant by spraying air.

According to this embodiment, the probe pin alignment device 100 performs position alignment based on the picture that captures the mirrors 110 reflecting the electrode pads 212P and 213P of the crystal oscillators 21 and the probe pins 331A and 331B before approaching the electrode pads 212P and 213P. The position alignment can thus be completed before the tips of the probe pins 331A and 331B come into contact with the respective electrode pads 212P and 213P of the crystal oscillators 21. This configuration can achieve position alignment in real time and thus increase the efficiency of the etching process.

According to this embodiment, the position alignment can be achieved by a simple structure because of the mirrors 110 inclined from the upper surface of the carrier 22.

According to this embodiment, the mirrors 110 inclined from the upper surface of the carrier 22 are attached on the block 332 provided with the probe pins 331A and 331B. The etching chamber 12 thus needs no space for accommodating the mirrors 110.

According to this embodiment, the probe pins 331A and 331B extend through the mirrors 110 attached on the inclined surfaces of the block 332. This arrangement can achieve imaging of a picture of the electrode pads 212P and 213P as viewed from above, leading to highly accurate position alignment.

According to this embodiment, the probe pins 331A and 331B are attached to the block 332 while extending through the mirrors 110 attached on the inclined surfaces of the block 332, which are inclined at 45° from the upper surface of the carrier 22. The mirrors 110 thus reflect images of the electrode pads 212P and 213P as viewed from directly above. This configuration can achieve adjustment of the positions of the probe pins as viewed from directly above to the positions of the pinholes 334 of the mirrors 110, leading to highly accurate position alignment.

EMBODIMENT 2

Although the description of Embodiment 1 is directed to the frequency adjustment apparatus 10 equipped with the probe pin alignment device 100, a probe pin alignment device according to the disclosure may also be applied to another apparatus. The following description is directed to a transfer apparatus equipped with a probe pin alignment device according to another embodiment, as illustrated in FIG. 8.

Figure 8:
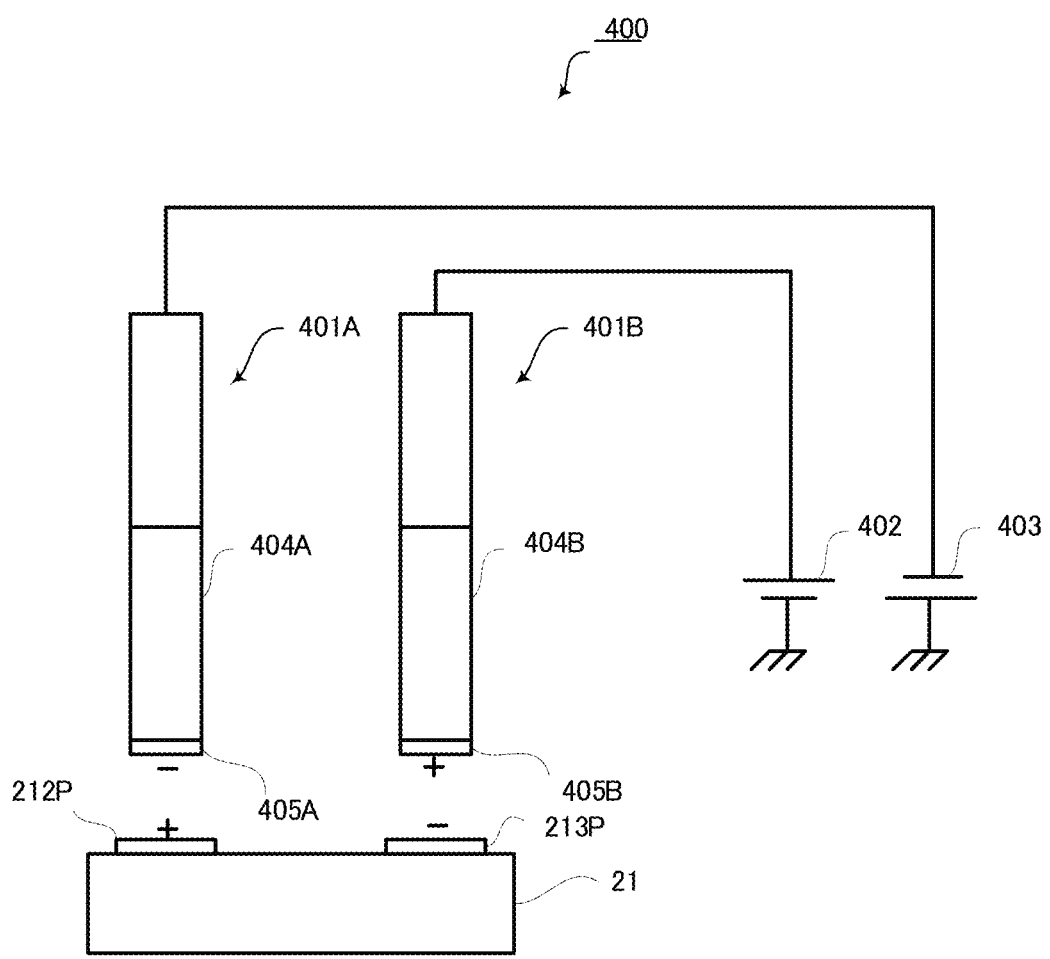
FIG. 8 is a conceptual diagram illustrating a main part of a transfer apparatus equipped with a probe pin alignment device according to Embodiment 2.

FIG. 8 is a conceptual diagram illustrating a main part of a transfer apparatus 400 for transferring the crystal oscillators 21. The transfer apparatus 400 causes the crystal oscillators 21 to be adsorbed on probe pins 401A and 401B by electrostatic adsorption and transfers the crystal oscillators 21 to another process.

The transfer apparatus 400 includes the probe pins 401A and 401B and power sources 402 and 403 connected to the respective probe pins 401B and 401A. The probe pins 401A and 401B respectively have electrodes 404A and 404B.

In response to application of a positive voltage from the power source 402 to the electrode 404B, the tip of the electrode 404B is provided with a positively charged layer 405B due to dielectric polarization. In response to application of a negative voltage from the power source 403 to the electrode 404A, the tip of the electrode 404A is provided with a negatively charged layer 405A due to dielectric polarization. These phenomena generate Coulomb's forces between the electrodes 404A and 404B and the respective electrode pads 212P and 213P of the crystal oscillators 21, so that the electrode pads 212P and 213P are adsorbed on the probe pins 401A and 401B.

The transfer apparatus 400 is used for transferring the crystal oscillators 21 to the subsequent process. For example, the transfer apparatus 400 contributes to transferring of the crystal oscillators 21 after frequency adjustment in the frequency adjustment apparatus 10 illustrated in FIG. 1 to an enclosing process for enclosing the crystal oscillators 21 into packages. One of the important factors in the transfer process is the position alignment of the electrodes 404A and 404B and the electrode pads 212P and 213P to be adsorbed on the respective electrodes 404A and 404B. Without proper position alignment, the crystal oscillators 21 would fall from the probe pins 401A and 401B during the transfer process.

The transfer apparatus 400 is also equipped with the probe pin alignment device 100 identical to that of Embodiment 1. As illustrated in FIG. 5, the probe pin alignment device 100 includes a block 406 provided with the probe pins 401A and 401B, the mirrors 110 attached on the block 406, the camera 120 for taking a picture containing mirror images reflected on the mirrors 110 and real images of the probe pins 401A and 401B, the deviation measurer 201 for measuring a deviation between the probe pin 401A or 401B and the electrode pad 212P or 213P based on the taken picture, the displacer 202 for displacing the block 406 based on the deviation, the controller 200 for controlling the deviation measurer 201 and the displacer 202, and the light source 130.

The block 406 of the transfer apparatus 400 has the shape identical to that of the block 332 of the contact mechanism 33 according to Embodiment 1. The block 406 is provided with N pairs of probe pins 401A and 401B corresponding to the N crystal oscillators 21 arranged in a single column among the crystal oscillators 21 on the carrier 22.

The mirrors 110 are attached at both ends of the block 406, as in Embodiment 1. The ends of the block 406 have respective inclined surfaces, which are inclined at 45° from the upper surface of the carrier 22 and on which the mirrors 110 are attached. As illustrated in FIG. 5, the probe pins 401A and 401B extend through the respective mirrors 110 attached on the inclined surfaces and attached to the block 406 such that the probe pins 401A and 401B are movable in the direction perpendicular to the upper surface of the carrier 22.

The process of alignment control in the transfer apparatus 400 will now be explained. The alignment control in the transfer apparatus 400 is initiated after extraction of the carrier 22 provided with the crystal oscillators 21 thereon from the extraction chamber 13, subsequent to completion of adjustment of the resonance frequencies of the crystal oscillators 21 in the etching chamber 12.

If the controller 200 detects extraction of the carrier 22 provided with the crystal oscillators 21 thereon from the extraction chamber 13, the controller 200 starts to control the probe pin alignment device 100. The process of alignment control is identical to the process illustrated in the flowchart of FIG. 6.

After completion of this alignment control, the block 406 descends to bring the probe pins 401A and 401B into contact with the respective electrode pads 212P and 213P. The probe pins 401A and 401B are then supplied with voltages so that the electrode pads 212P and 213P are electrostatically adsorbed on the probe pins 401A and 401B. These electrostatically adsorbed crystal oscillators 21 are transferred to a place for the subsequent process.

In the transfer apparatus 400 equipped with the probe pin alignment device 100 according to this embodiment, proper position alignment of the probe pins 401A and 401B and the electrode pads 212P and 213P is available before electrostatic adsorption in the process of transferring the crystal oscillators 21 to the subsequent process. These crystal oscillators 21 after proper position alignment are certainly adsorbed on the respective probe pins 401A and 401B and are prevented from falling during the transfer process. Since the position alignment is performed before the probe pins 401A and 401B come into contact with the electrode pads 212P and 213P, this configuration can avoid damage to the tips of the probe pins 401A and 401B or the crystal oscillators 21.

Modified Example

Figure 9:
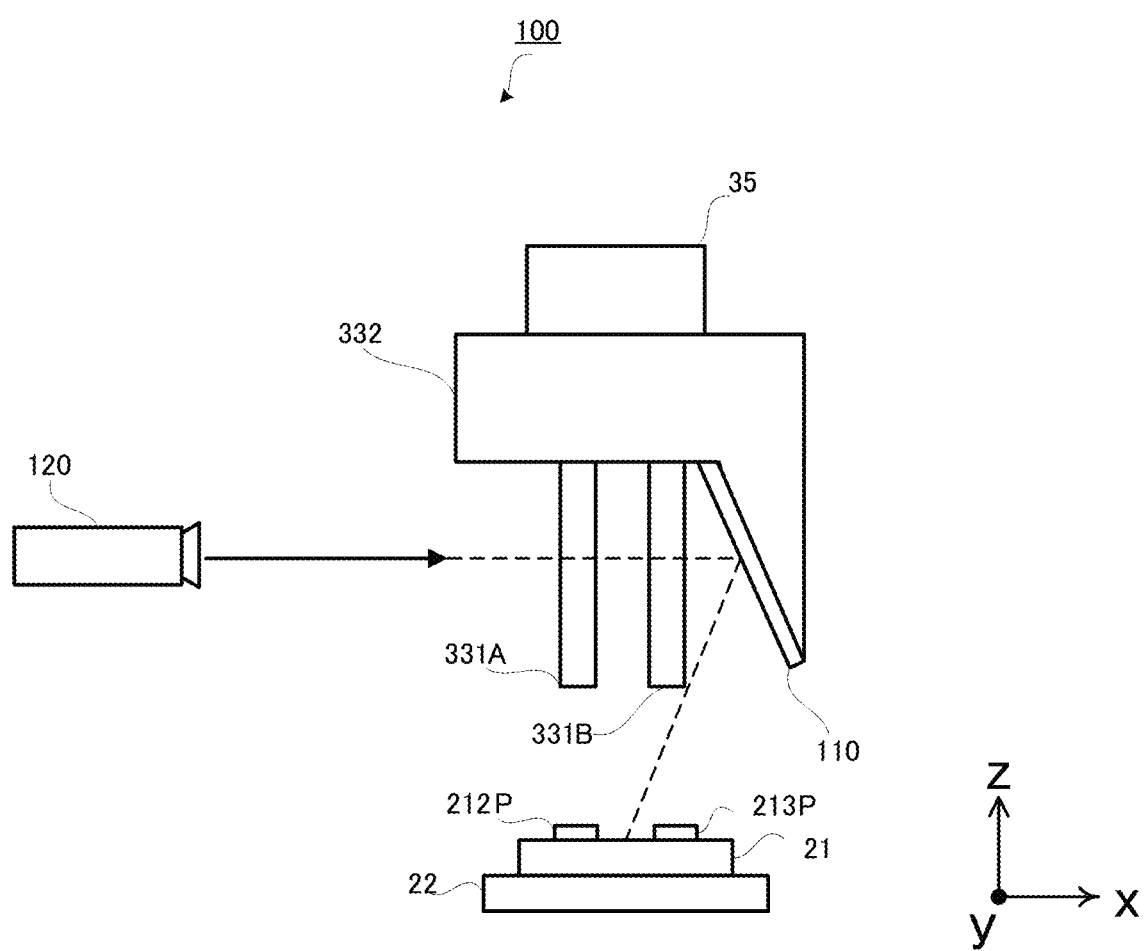
FIG. 9 illustrates a probe pin alignment device according to a modified example.

In Embodiment 1 or 2, the mirrors 110 are attached on the inclined surfaces of the block 332 (406), and the probe pins 331A and 331B (401A and 401B) are attached to the block 332 (406) while extending through the mirrors 110 on the inclined surfaces. Alternatively, the probe pins 331A and 331B (401A and 401B) may be attached without extending through the mirrors 110. For example, as illustrated in FIG. 9, the probe pin alignment device 100 includes the block 332 having inclined surfaces and the probe pins 331A and 331B protruding from the lower surface of the block 332. The inclined surfaces are located behind the probe pins 331A and 331B as viewed from the camera 120. The inclined surfaces are inclined from the upper surface of the carrier 22 and are provided with the respective mirrors 110. The mirrors 110 reflect mirror images of both of the probe pins 331A and 331B and the electrode pads 212P and 213P while the probe pins 331A and 331B are approaching the crystal oscillators 21.

The deviation measurer 201 then measures deviations between the positions of the probe pins 331A and 331B and the positions of the electrode pads 212P and 213P in the taken picture containing mirror images reflected on the mirrors 110. The controller 200 causes the displacer 202 to displace the block 332 with the stage unit 35 such that the measured deviations are substantially zero.

According to this modified example, since the mirrors 110 can reflect mirror images of the electrode pads 212P and 213P while the probe pins 331 are approaching the electrode pads 212P and 213P, the position alignment can be completed before the probe pins 331 come into contact with the electrode pads 212P and 213P. In addition, since the probe pins 331A and 331B do not extend through the mirrors 110, this configuration requires no processing to the mirrors 110.

Although the alignment control is performed before descending movements of the probe pins 331A and 331B in Embodiment 1, 2, or the modified example, the alignment control may also be performed during the descending movements. Alternatively, the alignment control may be repeated a plurality of times before and during the descending movements. The alignment control repeated a plurality of times can increase the accuracy of position alignment.

Although the mirrors 110 are attached on the block 332 (406) in Embodiment 1 or 2, it is not necessary to attach the mirrors 110 on the block 332 (406). For example, two mirrors or a single curved mirror may be disposed at a side position between the block 332 (406) and the probe pins 331A and 331B (401A and 401B), for example, attached on a wall of the etching chamber 12 so as to reflect mirror images of both of the probe pins 331A and 331B and the electrode pads 212P and 213P.

Although the mirrors 110 are inclined at 45° from the upper surface of the carrier 22 in Embodiment 1 or 2, the mirrors 110 may be attached at any angle provided that the mirrors 110 can reflect mirror images of both of the probe pins 331A and 331B and the electrode pads 212P and 213P. It should be noted that, in the modified example, the camera 120 cannot be disposed such that the line segment from the crystal oscillator 21 on the carrier 22 to the mirror 110 forms an angle of 90° from the optical axis of the camera 120 to the mirror 110. This configuration of the modified example is inferior to that of Embodiment 1 or 2 in terms of accuracy of deviation measurement, but can be applied to an electronic device including relatively large electrode pads 212P and 213P. Alternatively, the mirrors 110 may be attached in parallel to the upper surface of the carrier 22 without inclination. In this configuration, the camera 120 takes a picture of the mirrors 110 via inclined additional mirrors disposed at side positions between the block 332 (406) and the probe pins 331A and 331B (401A and 401B).

Although the position alignment is performed by displacing the probe pins 331A and 331B (401A and 401B) in the x- or y-axis direction with the stage unit 35 (45) in Embodiment 1 or 2, the position alignment may also be performed by correction of deviations in the z-axis direction or the θ direction. In this case, additional motors are provided to displace the block 332 (406) in the z-axis direction or the θ direction, and the deviation measurer 201 measures a deviation in the z-axis direction.

Although the position alignment is performed by displacing the probe pins 331A and 331B (401A and 401B) with the stage unit 35 (45) in Embodiment 1 or 2, the position alignment may also be performed by displacing the carrier 22 by a driving mechanism coupled to the carrier 22. Alternatively, both of the stage unit 35 (45) and the carrier 22 may be displaced. That is, the configuration is only required to allow for relative displacement between the probe pins 331A and 331B (401A and 401B) and the electronic device on the carrier 22.

Although the electrode pads 212P and 213P are arranged at diagonal positions on the same main surface of each crystal oscillator 21 in Embodiment 1 or 2, the electrode pads 212P and 213P may also be arranged at parallel positions other than the diagonal positions. That is, the disclosure is applicable to crystal oscillators having various types of electrode pads.

Although the camera 120 is disposed inside the vacuum chamber in Embodiment 1 or 2, the camera 120 may also be disposed outside the vacuum chamber to measure deviations.

The block 332 (406) moves toward or away from the crystal oscillators 21 in Embodiment 1 or 2, the distance between the crystal oscillators 21 and the probe pins 331A and 331B (401A and 401B) may also be varied by movements in the up-down direction of the carrier 22 including the crystal oscillators 21 mounted thereon.

Although the transfer apparatus 400 is provided with N pairs of probe pins 401A and 401B corresponding to the N crystal oscillators 21 arranged in a single column on the carrier 22 in Embodiment 2, it is not necessary for the number of the crystal oscillators 21 to be equal to the number of pairs of the probe pins 401A and 401B. This correspondence relationship may be varied depending on the number of the crystal oscillators 21 that should be transferred at once.

The disclosure can be applied to a probe pin alignment device for alignment of the positions of electrode pads of an electronic device and the positions of probe pins.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A probe pin alignment device for position alignment of a probe pin and an electronic device placed on a surface of a base, a tip of the probe pin being brought into contact with an electrode pad of the electronic device, the probe pin alignment device comprising:

a mirror configured to reflect a mirror image of at least the electrode pad of the electronic device while the probe pin is approaching the electrode pad;

a camera configured to take a picture including an image of the probe pin approaching the electrode pad and the mirror image reflected on the mirror;

a deviation measurer configured to measure a deviation between a position of the probe pin and a position of the electrode pad of the electronic device in the picture taken by the camera;

a displacer configured to relatively displace the base and the probe pin; and a controller configured to cause the displacer to relatively displace the base and the probe pin such that the deviation measured by the deviation measurer is substantially zero.

2. The probe pin alignment device according to claim 1, wherein the mirror is inclined from the surface of the base.

3. The probe pin alignment device according to claim 1, further comprising a block to which the probe pin is attached, wherein the mirror is attached on the block.

4. The probe pin alignment device according to claim 3, wherein the block has an inclined surface opposite to and inclined from the surface of the base, the mirror is attached on the inclined surface, the probe pin is attached to the block while extending through the mirror attached on the inclined surface, and the deviation measurer measures a deviation between the position of the probe pin and the position of the electrode pad of the electronic device, based on (i) a position of the probe pin extending through the mirror in a real image and (ii) a position of the electrode pad of the electronic device in the mirror image in the picture taken by the camera.

5. The probe pin alignment device according to claim 4, wherein the controller controls the displacer such that the position of the electrode pad of the electronic device accords with the position of the probe pin in the taken picture based on the deviation measured by the deviation measurer.

6. The probe pin alignment device according to claim 1, wherein the mirror also reflects a mirror image of the probe pin approaching the electrode pad, and the deviation measurer measures a deviation between the position of the probe pin and the position of the electrode pad of the electronic device, based on a position of the probe pin and a position of the electrode pad of the electronic device in the mirror image in the picture taken by the camera.

7. The probe pin alignment device according to claim 2, further comprising a block to which the probe pin is attached, wherein the mirror is attached on the block.

8. The probe pin alignment device according to claim 7, wherein the block has an inclined surface opposite to and inclined from the surface of the base, the mirror is attached on the inclined surface, the probe pin is attached to the block while extending through the mirror attached on the inclined surface, and the deviation measurer measures a deviation between the position of the probe pin and the position of the electrode pad of the electronic device, based on (i) a position of the probe pin extending through the mirror in a real image and (ii) a position of the electrode pad of the electronic device in the mirror image in the picture taken by the camera.

9. The probe pin alignment device according to claim 8, wherein the controller controls the displacer such that the position of the electrode pad of the electronic device accords with the position of the probe pin in the taken picture based on the deviation measured by the deviation measurer.

\* \* \* \* \*